US011646265B2

(12) United States Patent
Kim et al.

(10) Patent No.: US 11,646,265 B2
(45) Date of Patent: May 9, 2023

(54) SEMICONDUCTOR DEVICE

(71) Applicant: SK hynix Inc., Icheon-si (KR)

(72) Inventors: Dong Hyuk Kim, Icheon-si (KR); Sung Lae Oh, Icheon-si (KR); Tae Sung Park, Icheon-si (KR); Soo Nam Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 78 days.

(21) Appl. No.: 17/079,267

(22) Filed: Oct. 23, 2020

(65) Prior Publication Data
US 2021/0287982 A1 Sep. 16, 2021

(30) Foreign Application Priority Data
Mar. 16, 2020 (KR) .................. 10-2020-0032053

(51) Int. Cl.
*H01L 23/528* (2006.01)
*H01L 27/11573* (2017.01)
*G11C 7/18* (2006.01)
*H01L 23/522* (2006.01)
*H01L 23/535* (2006.01)
*H01L 27/11529* (2017.01)
*H01L 27/11578* (2017.01)
*H01L 27/11551* (2017.01)

(52) U.S. Cl.
CPC ............. *H01L 23/528* (2013.01); *G11C 7/18* (2013.01); *H01L 23/5226* (2013.01); *H01L 23/535* (2013.01); *H01L 27/11529* (2013.01); *H01L 27/11551* (2013.01); *H01L 27/11573* (2013.01); *H01L 27/11578* (2013.01)

(58) Field of Classification Search
CPC ............... H01L 23/528; H01L 27/0207; H01L 27/11529; H01L 27/11573; H01L 27/10897; H01L 27/11286; H01L 27/11512; H01L 27/11575; G11C 7/18; G11C 5/06; G11C 7/12; G11C 16/24; G11C 2207/002; G11C 16/08; G11C 16/10; G11C 7/00; G11C 2207/005; G11C 2207/12
See application file for complete search history.

(56) References Cited

U.S. PATENT DOCUMENTS

| 6,015,641 A | * | 1/2000 | Chou | .................. G03F 7/70441 |
| | | | | 430/5 |
| 8,040,726 B2 | * | 10/2011 | Kwak | ..................... G11C 16/10 |
| | | | | 365/185.26 |
| 9,899,323 B2 | | 2/2018 | Seong et al. | |
| 10,056,404 B2 | * | 8/2018 | Lee | ................... H01L 27/11582 |
| 2009/0034336 A1 | * | 2/2009 | Kwak | ............... H01L 27/11519 |
| | | | | 365/185.17 |

(Continued)

FOREIGN PATENT DOCUMENTS

KR 10-2015-0069423 A 6/2015

*Primary Examiner* — Galina G Yushina

(57) ABSTRACT

A semiconductor device is disclosed, which relates to a three-dimensional (3D) semiconductor memory device. The semiconductor device includes a first connection pattern, a bit line disposed over the first connection pattern in a vertical direction, and a bit-line contact pad, disposed in a first layer between the bit line and the first connection pattern to electrically couple the bit line to the first connection pattern so that the bit-line contact pad, and formed as an island when viewed along the vertical direction.

10 Claims, 9 Drawing Sheets

(56) References Cited

U.S. PATENT DOCUMENTS

| | | | |
|---|---|---|---|
| 2013/0176782 A1* | 7/2013 | Lee | G11C 16/04 365/185.05 |
| 2015/0003158 A1* | 1/2015 | Aritome | G11C 16/10 365/185.11 |
| 2018/0277225 A1* | 9/2018 | Park | G11C 11/5621 |
| 2019/0385674 A1* | 12/2019 | Cho | G11C 7/12 |

* cited by examiner

SEMICONDUCTOR DEVICE

CROSS-REFERENCE TO RELATED APPLICATION

This patent document claims the priority to and the benefits of Korean patent application No. 10-2020-0032053 filed on Mar. 16, 2020, which is hereby incorporated in its entirety by reference.

TECHNICAL FIELD

The technology and implementations disclosed herein generally relate to a semiconductor device, and more particularly to a three-dimensional (3D) semiconductor memory device.

BACKGROUND

A semiconductor device may include a memory cell array provided with a plurality of memory cells. The memory cell array may include a plurality of memory cells arranged in various shapes. In order to increase the degree of integration of semiconductor devices, memory cells may be three-dimensionally (3D) arranged over a semiconductor substrate. In a fabrication process used to form a three-dimensional (3D) semiconductor device, a plurality of material films can be stacked to form a stacked structure.

SUMMARY

Various embodiments of the disclosed technology relate to a semiconductor device for improving the degree of freedom in line (or wire) connections.

In accordance with an embodiment of the disclosed technology, a semiconductor device may include a first connection pattern, a bit line disposed over the first connection pattern in a vertical direction, and a bit-line contact pad, disposed in a first layer between the bit line and the first connection pattern to electrically couple the bit line to the first connection pattern, and formed as an island when viewed along the vertical direction.

In accordance with another embodiment of the disclosed technology, a semiconductor device may include a plurality of gate electrodes formed to extend in a second direction, and spaced apart from each other by a predetermined distance in a first direction, as viewed from a vertical direction and a plurality of bit-line contact pads spaced apart from each other by a predetermined distance in the first direction, wherein each of the plurality of bit-line contact pads, disposed between a bit line and a lower connection structure in the vertical direction to electrically connect the bit line to the lower connection structure, has an island shape when viewed along the vertical direction.

In accordance with still another embodiment of the disclosed technology, a semiconductor device may include a substrate in which a first region and a second region are defined, a logic circuit stacked on the substrate that includes a page buffer circuit, a memory cell array stacked on the logic circuit, a bit line formed over the memory cell array, a bit-line contact pad formed in the first region that electrically connects the bit line to the page buffer circuit, and a plurality of connection patterns formed below the bit-line contact pad in a vertical direction, wherein the bit line and the bit-line contact pad are electrically coupled to a junction region of a transistor of the page buffer circuit through the plurality of connection patterns.

It is to be understood that both the foregoing general description, and the following detailed description, of the technology disclosed herein are illustrative and explanatory and intended to provide further explanation of the scope of the disclosure to those skilled in the art.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of a semiconductor device that substantially addresses one or more issues related to limitations or disadvantages of the related art. Some implementations of the disclosed technology suggest a semiconductor device with line connections having an improved and greater degree of freedom.

Reference will now be made in detail to aspects of the disclosed technology, embodiments and examples of which are illustrated in the accompanying drawings. Wherever possible, the same reference numbers are used throughout the drawings to refer to the same or like portions.

In association with the embodiments of the disclosed technology, specific structural and functional descriptions are disclosed only for illustrative purposes. The embodiments represent a limited number of possible embodiments, however, embodiments of the disclosed technology can be implemented in various and different ways without departing from the scope or spirit of the disclosed technology.

In describing the disclosed technology, the terms "first" and "second" may be used to describe multiple components, but the components are not limited by the terms in number or order. The terms may be used to distinguish one component from another component. For example, a first component may be called a second component and a second component may be called a first component without departing from the scope of the disclosure.

The terms used in the present application are merely used to describe specific embodiments and are not intended to limit the disclosed technology. A singular expression may include a plural expression unless explicitly stated otherwise.

Unless otherwise defined, all terms used herein, including technical or scientific terms, have the same meanings as understood by those skilled in the art. Terms defined in a generally used dictionary may be analyzed to have the same meaning as the context of the relevant art and should not be analyzed to have an ideal meaning or an excessively formal meaning unless clearly defined in the present application. The terminology used in the disclosed technology is for the purpose of describing particular embodiments only and is not intended to limit the disclosure.

Figure 1:
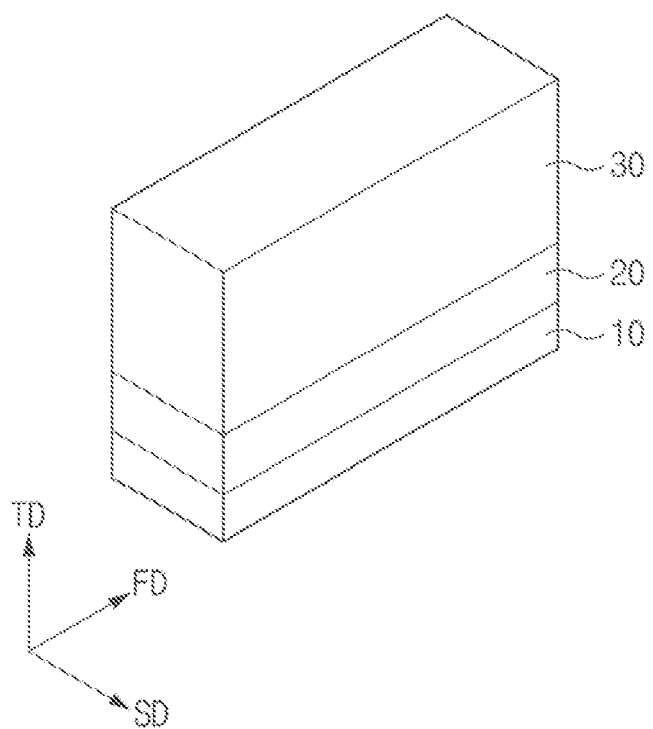
FIG. 1 is a perspective view illustrating a semiconductor device in accordance with an embodiment of the disclosure.

FIG. 1 is a block diagram illustrating a semiconductor device in accordance with an embodiment of the disclosure. In FIG. 1, a third direction (TD) is a direction perpendicular to a horizontal plane formed to extend in each of a first direction (FD) and a second direction (SD). For example, the third direction (TD) may be perpendicular to each of the first direction (FD) and the second direction (SD).

Referring to FIG. 1, the semiconductor device may include a logic circuit 20 and a memory cell array 30 that are disposed over a substrate 10.

The substrate 10 may be a monocrystalline semiconductor film. For example, the substrate 10 may be any one of a bulk-silicon substrate, a silicon-on-insulator (SOI) substrate, a germanium (Ge) substrate, a germanium-on-insulator (GOI) substrate, and a silicon-germanium substrate, or may be an epitaxial thin film that is formed by a selective epitaxial growth (SEG) process.

The memory cell array 30 may include a plurality of memory blocks, each of which is denoted by "BLK" to be described later. Each memory block may include a plurality of cell strings, each of which is denoted by "CST" to be described later. Each cell string may be electrically coupled to a gate stack, a bit line, and a source line. The gate stack may include a plurality of word lines and a plurality of select lines. Each of the select lines may be used as a gate electrode for a corresponding select transistor, and each of the word lines may be used as a gate electrode of a corresponding memory cell.

The logic circuit 20 may include NMOS transistors, PMOS transistors, at least one resistor, and at least one capacitor that are electrically coupled to the memory cell array 30. The NMOS transistors, the PMOS transistors, the resistor, and the capacitor may be used as constituent elements of a row decoder, a column decoder, a page buffer circuit, and a control circuit.

In some embodiments, the logic circuit 20 may be disposed between the memory cell array 30 and the substrate 10. For example, the memory cell array 30 may be formed to overlap with the logic circuit 20 as viewed in the third direction (TD). If the memory cell array 30 overlaps with the logic circuit 20, then the region of the substrate 10 on which by the memory cell array 30 and the logic circuit 20 are disposed can be reduced in size. In other embodiments, the memory cell array 30 may be disposed between the logic circuit 20 and the substrate 10.

Figure 2:
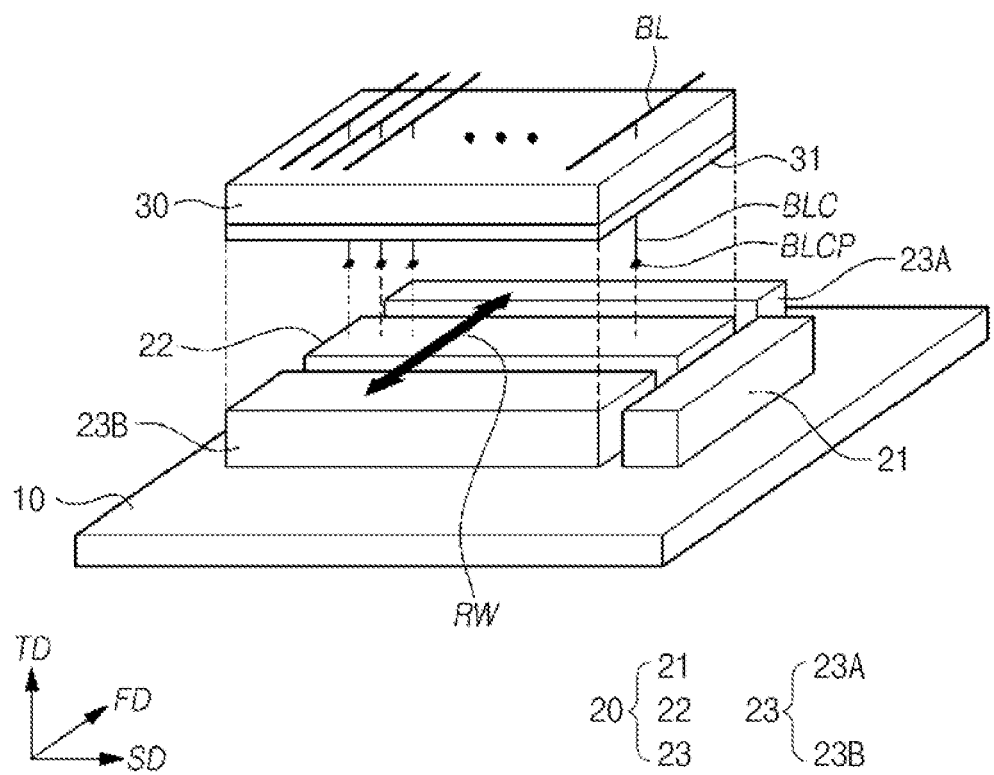
FIG. 2 is a perspective view illustrating a semiconductor device of FIG. 1 in accordance with an embodiment of the disclosure.

FIG. 2 is a perspective view illustrating a semiconductor device of FIG. 1 in accordance with an embodiment of the disclosure.

Referring to FIG. 2, the logic circuit 20 may be disposed over the substrate 10, and the memory cell array 30 may be disposed over a source plate 31 located or disposed above the logic circuit 20.

The substrate 10 may be a first conductive semiconductor substrate, for example, a P-type conductive semiconductor substrate. The source plate 31 may be formed of a polycrystalline silicon layer.

The logic circuit 20 may include a row decoder 21, a page buffer circuit 22, and a peripheral circuit 23. The row decoder 21 may be formed to extend in the first direction (FD) at or near an edge of the substrate 10.

The page buffer circuit 22 may be formed to extend in the second direction (SD). The page buffer circuit 22 may be formed under the memory cell array 30. The page buffer circuit 22 may be formed to overlap with the memory cell array 30 at a lower part of the memory cell array 30.

The peripheral circuit 23 may be disposed on the substrate 10 at opposite sides of, and arranged in the first direction (FD) from, the page buffer circuit 22. For convenience of description, a portion of the peripheral circuit 23 disposed at one side of the page buffer circuit 22, in the first direction (FD), will hereinafter be defined as a first peripheral circuit 23A, and a portion of the peripheral circuit 23 disposed at the other side of the page buffer circuit 22 will hereinafter be defined as a second peripheral circuit 23B.

The first peripheral circuit 23A may be electrically coupled to the second peripheral circuit 23B through lines (RW), which are arranged to traverse an upper portion of the page buffer circuit 22 in the first direction (FD). Lines (RW) may transmit power and signals to the first peripheral circuit 23A and the second peripheral circuit 23B.

In some embodiments, the first peripheral circuit 23A and the second peripheral circuit 23B may be respectively disposed at both sides of the page buffer circuit 22, and similarly a row decoder 21 may be divided and coupled to opposite sides of the page buffer circuit 22, arranged in either the first or second direction (FD, SD). However, the scope or spirit of the disclosed technology is not limited thereto, and in other embodiments, the directions and positions of the page buffer circuit 22, the peripheral circuits 23, and the row decoder 21 may be changed, and the numbers of the page buffer circuit 22, the peripheral circuits 23, and the row decoder 21 may also be changed as necessary.

Bit lines (BL) may be disposed over the memory cell array 30. The bit lines (BL) may be formed to extend in the first direction (FD), and may be disposed in the second direction (SD). The bit lines (BL) may be used to interconnect the memory cell array 30 and the page buffer circuit 22, and may be electrically coupled to the memory cell array 30 and the page buffer circuit 22.

The page buffer circuit 22 and the bit lines (BL) may be electrically connected by a plurality of bit-line contact pads (BLCP), electrically coupled to the page buffer circuit 22, and disposed in any one of line layers disposed between the page buffer circuit 22 and the source plate 31. The bit lines (BL) may be coupled to the bit-line contact pads (BLCP) through the bit-line contacts (BLC), which are formed to penetrate the memory cell array 30 and the source plate 31 in the third direction (TD). The bit-line contact pads (BLCP) may serve as landing pads for the bit-line contacts (BLC).

Figure 3:
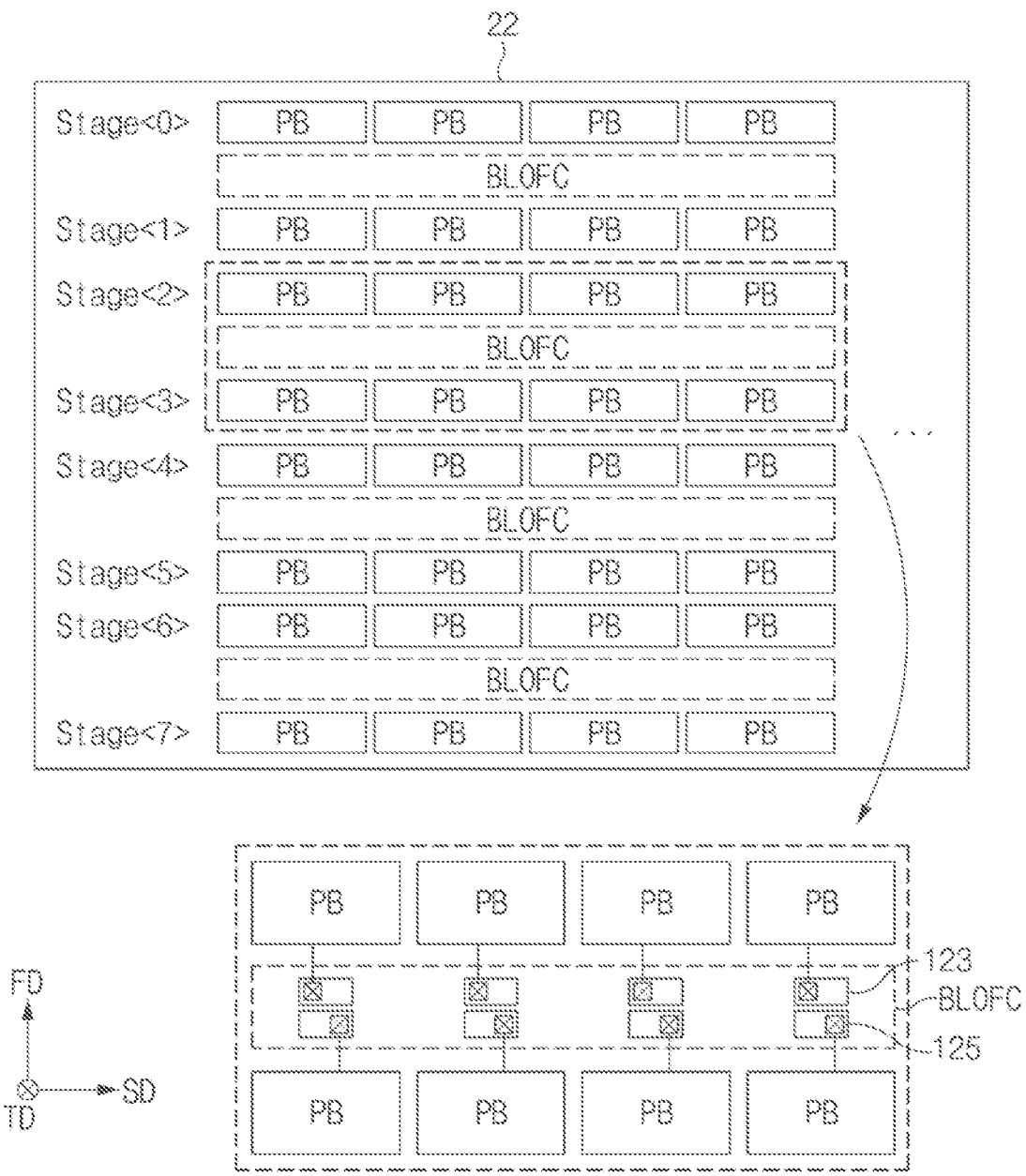
FIG. 3 is a schematic diagram illustrating a layout structure of a page buffer circuit in FIG. 2 in accordance with an embodiment of the disclosure.

FIG. 3 is a schematic diagram illustrating a layout structure of the page buffer circuit 22 in FIG. 2 in accordance with an embodiment of the disclosure.

Referring to FIG. 3, the page buffer circuit 22 may include a plurality of page buffers (PB). The page buffers (PB) may be formed in a matrix-like shape having 8 rows. For example, a row or page buffers may extend in the second direction (SD), and the rows may be spaced apart or arranged in the first direction (FD). The page buffer circuit 22 may include 8 stages Stage<0> to Stage<7>. The number of stages of the page buffer circuit 22 may be understood as the number of page buffers (PB) arranged in the extension direction of the bit lines (BL). Although FIG. 3 illustrates an exemplary case in which the page buffer circuit 22 includes 8 stages for convenience of description, the scope or spirit of the disclosed technology is not limited thereto and the number of stages may vary in other embodiments.

A bit-line contact region (BLOFC) may be disposed between two stages (i.e., one pair of stages) contiguous or adjacent to each other. For example, a bit-line contact region (BLOFC) may be disposed between the stage Stage<0> and the stage Stage<1>, between the stage Stage<2> and the stage Stage<3>, between the stage Stage<4> and the stage Stage<5>, and between the stage Stage<6> and the stage Stage<7>.

In the stacked semiconductor device shown in FIG. 1, lines for electrically coupling a lower connection structure, such as for example a lower portion of a memory cell array, to bit lines (BL) are needed for signal communication between the logic circuit 20 and the memory cell array 30. Such lines may be disposed in a specific region of the stacked semiconductor device. For example, in a bit-line contact region (BLOFC), lines, for coupling transistors contained in the page buffer (PB) of the logic circuit 20 to the bit lines of the memory cell array 30, and corresponding pads may be disposed.

Connection patterns 123 coupled to the page buffers (PB) contained in the contiguous stages may be disposed in the bit-line contact region (BLOFC). The connection patterns 123 may be coupled to upper lines through contact plugs 125.

FIG. 3 illustrates an exemplary case in which the connection patterns 123 are disposed in two columns in the second direction (SD). The connection patterns 123 in the first column (i.e., the upper column) may be coupled to the page buffers (PB) of the stage located at one side (i.e., at an upper side), in the first direction (FD), of the bit-line contact region (BLOFC). Connection patterns 123 in the second column (i.e., the lower column) may be coupled to the page buffers (PB) of the stage located at the other side (i.e., at a lower side) of the bit-line contact region (BLOFC). Although FIG. 3 illustrates an exemplary case in which the connection patterns 123 are disposed in two columns for convenience of description, the number of columns contained in the connection patterns 123 is not limited thereto.

Figure 4:
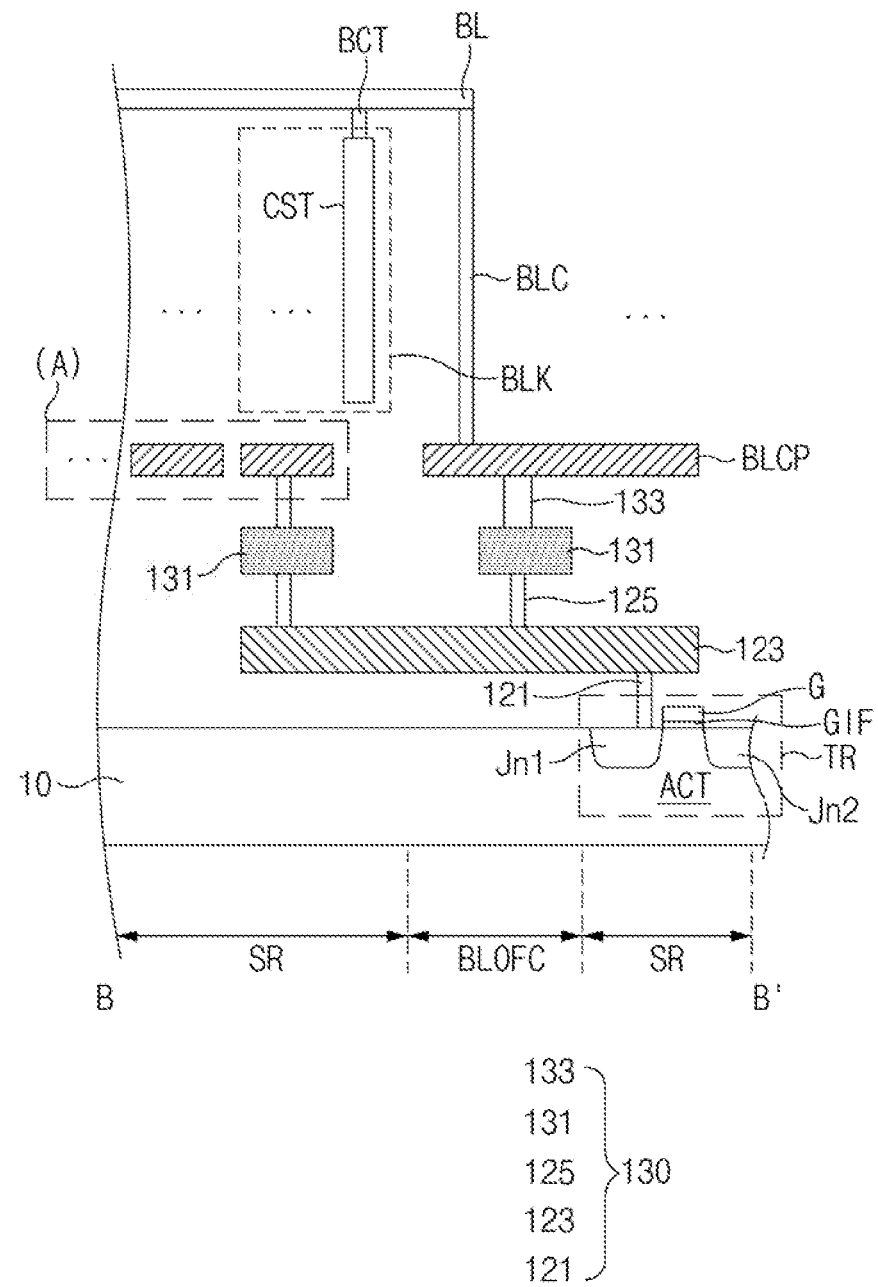
FIG. 4 is a schematic diagram illustrating structures in FIG. 1 in accordance with an embodiment of the disclosure.

FIG. 4 is a schematic diagram illustrating structures in FIG. 1 in accordance with an embodiment of the disclosure. (A structure cut in the direction B-B' in FIG. 5 to be described later) For clarity, interlayer insulation films are not shown in FIG. 4.

Referring to the embodiment of FIG. 4, the page buffer circuit 22 may be disposed in a lower layer of the bit lines. A transistor (TR) included in the page buffer circuit 22 may be electrically connected to the bit lines disposed in the upper layer. The transistor (TR) may be coupled through a lower connection structure 130, a bit-line contact pad (BLCP), and a bit-line contact (BLC), such that the transistor (TR) may be electrically connected to a corresponding bit line (BL).

The transistor (TR) may be contained in a page buffer (PB) illustrated in FIG. 3. The page buffer (PB) shown in FIG. 3 may further include a plurality of transistors in addition to the transistor (TR) shown in FIG. 4.

The transistor (TR) may include junctions Jn1 and Jn2 defined in an active region (ACT) of the substrate 10, and a gate electrode (G) formed in the active region (ACT) of the substrate 10. The active region (ACT) of the substrate 10 may be defined between device isolation layers (not shown) formed in the substrate 10.

The gate electrode (G) may be formed over the active region (ACT) of the substrate 10 common to a gate insulation film (GIF) interposed therebetween. Each of the junctions Jn1 and Jn2 may be a region defined by implanting conductive impurities in the active region (ACT) of the substrate 10, and the junctions Jn1 and Jn2 may be disposed at opposite sides of the gate electrode (G). For example, each of the junctions Jn1 and Jn2 may include N-type impurities. Each of the junctions Jn1 and Jn2 may be used as a source junction or a drain junction.

The junction (Jn1) of the transistor (TR) may be in contact with the lower connection structure 130. The junction (Jn1) may be one of junctions of the transistor (TR), and may be defined in the active region (ACT) of the substrate 10 partitioned by one or more device isolation layers (not shown).

The lower connection structure 130 may include a first conductive contact plug 121, a connection pattern 123, a second conductive contact plug 125, a connection pattern 131, and a third conductive contact plug 133 that are stacked between the junction (Jn1) of the transistor (TR) and the bit-line contact pad (BLCP).

In this example, the first conductive contact plug 121 may be in contact with the junction (Jn1). The connection pattern 123 may be disposed over the first conductive contact plug 121. When viewed in a third direction (TD), the connection pattern 123 may be larger in size than the first conductive contact plug 121, resulting in an increased contact margin. The second conductive contact plug 125 may be formed to extend in the direction from the connection pattern 123 to the bit-line contact pad (BLCP).

The connection pattern 131 may be a metal pattern, and may be disposed over the second conductive contact plug 125. When viewed in the third direction (TD), the connection pattern 131 may be larger in size than the second conductive contact plug 125, resulting in an increased contact margin. The third conductive contact plug 133 may be disposed between the connection pattern 131 and the bit-line contact pad (BLCP). The third conductive contact plug 133 may be disposed over the connection pattern 131, and may be formed to extend in the direction from the connection pattern 131 to the bit-line contact pad (BLCP) such that the extended third conductive contact plug 133 can be in contact with the bit-line contact pad (BLCP) and the connection pattern 131.

The bit-line contact pad (BLCP) may be a bit-line connection pad through which the lower connection structure 130 is coupled to the bit lines (BL). The bit-line contact pad (BLCP) may be used as a landing pad in which bit-line contacts (BLC) are landed, and may be arranged to correspond to an arrangement structure of the bit lines (BL).

The bit-line contact pad (BLCP) may be electrically coupled to the connection pattern 123 and the contact plug 125 shown in FIG. 3. The bit-line contact pad (BLCP) may be formed of a conductive line. The bit-line contact pad (BLCP) may be formed or dispose in the same layer as a conductive line (A). The bit-line contact pad (BLCP) may be disconnected from the conductive line (A), such that the bit-line contact pad (BLCP) may be formed in an island shape. That is, the conductive line (A) may be truncated or segmented to result in a stand-alone bit-line contact pad (BLCP). As a result, the degree of freedom in a line connection of the remaining portion of conductive line (A), now disconnected from the bit-line contact pad (BLCP), can be improved.

Cell strings (CST) may be contained in memory blocks (BLK). Each of the cell strings (CST) may be coupled to a bit line (BL) after passing through a bit-line contact plug (BCT). The cell strings (CST) may be formed in various shapes. The cell strings (CST) may be coupled to the bit-line contact pad (BLCP) through the bit line (BL) and the bit-line contact (BLC). In this case, the bit-line contact (BLC) may be formed as a conductive contact plug.

In some embodiments, the bit line (BL), the bit-line contact (BLC), the bit-line contact pad (BLCP), the third conductive contact plug 133, the connection pattern 131, the second conductive contact plug 125, and the connection pattern 123 may be vertically coupled to one another in a column in the third direction (TD), resulting in formation of a vertical structure. The lower connection pattern 123 may be electrically coupled to lines of the transistor (TR) of the page buffer (PB) through the first conductive contact plug 121.

As viewed in the third direction (TD), a specific region in which the bit line (BL), the bit-line contact (BLC), the bit-line contact pad (BLCP), the third conductive contact plug 133, the connection pattern 131, the second conductive contact plug 125, and the connection pattern 123 are arranged may be defined as a bit-line contact region (BLOFC) (i.e., a first region to be described later). In addition, a region located at both sides of the bit-line contact region (BLOFC) in the first direction (FD) may be defined as a second region (SR) (to be described later). The transistors (TR) of the page buffers (PB) may be disposed over the second region (SR). In the second region (SR), the connection pattern 123 may be electrically coupled to the junction (Jn1) of the transistor (TR) through the first conductive contact plug 121.

Figure 5:
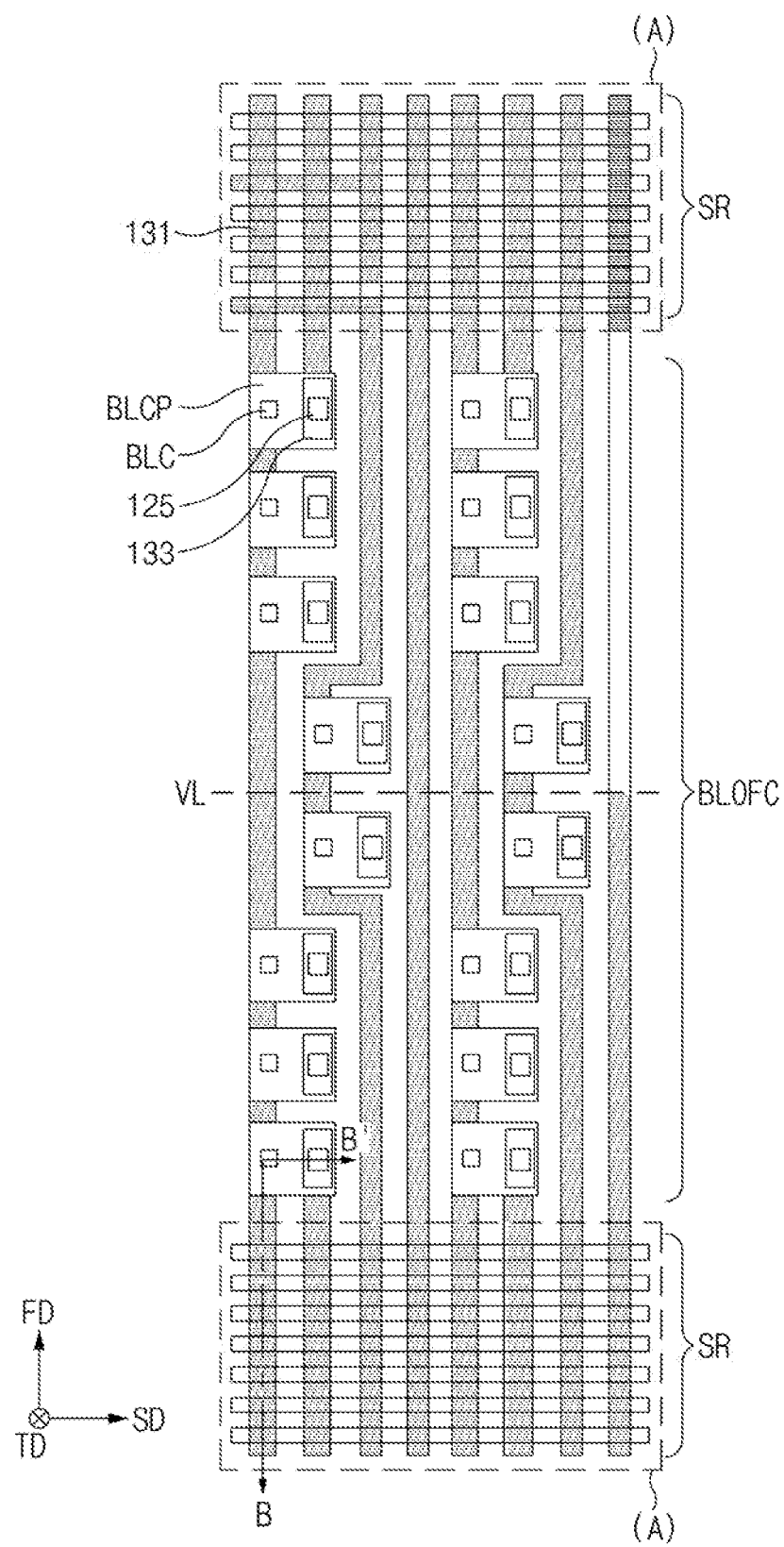
FIG. 5 is a layout diagram illustrating elements of a semiconductor device in FIG. 4 in accordance with an embodiment of the disclosure.

FIG. 5 is a layout diagram illustrating elements of a semiconductor device in FIG. 4 in accordance with an embodiment of the disclosure. To simplify the drawings, only line layers needed to further explain embodiments of the disclosure are illustrated in FIG. 5.

Referring to FIG. 5, the first region (BLOFC) and the second region (SR) may be defined in the substrate (not shown). The bit-line contact pads (BLCP) coupled to the page buffers (PB) contained in an adjacent pair of stages may be arranged in the first region (BLOFC).

In FIG. 5, the first region (BLOFC) may be substantially the same as the bit-line contact region (BLOFC) shown in FIG. 4. The second region (SR) may be located at both sides, in the first direction (FD), of the bit-line contact region (BLOFC). The page buffers (PB) illustrated in FIG. 4 may be disposed over the second region (SR).

The connection pattern 131 may be disposed in a lower plane of the bit-line contact pad (BLCP). The connection pattern 131 may be formed in a line shape extending in the first direction (FD). However, some portions of the connection pattern 131 may be configured with angles, curves or bends that allow the connection pattern 131 to intersect with the connection pattern 123 of a bit-line contact pad (BLCP), as viewed in the third direction (TD). For example, the connection pattern 131 may form a dogleg around bit-line contact pads (BLCP) in the bit-line contact region (BLOFC) that are offset from each other in the second direction (SD).

The overall extension direction of the connection patterns 131 may be identical to the first direction (FD). The second direction (SD) may be considered to be an arrangement direction of the connection patterns 131. The connection patterns 131 may be arranged at intervals of a constant pitch in the second direction (SD).

The bit-line contact pads (BLCP) may be disposed in a lower plane or portion of the bit line (not shown). That is, the bit-line contact pads (BLCP) may be disposed over an upper plane of or above the connection patterns 131, and above a lower connection structure 130. The bit-line contact pads (BLCP) may be formed in the bit-line contact region (BLOFC). Each of the bit-line contact pads (BLCP) may be formed in a rectangular, island-like shape by disconnecting and removing portions or segments of connection lines. For example, the rectangular island shape is not identical to a line shape that is formed by extending a conductive line formed over the same layer in a predetermined direction, and instead may refer to an integrated pad in which at least some parts of the rectangular island-like shape are disconnected and constructed independently from each other.

Not only the lower connection structure 130, but also contact plugs (not illustrated) for electrically coupling the upper bit-line contact (BLC) to the bit lines may be formed over the bit-line contact pads (BLCP). The bit-line contact pads (BLCP) may be electrically coupled to the lower connection pattern 123 through the second conductive contact plug 125. The third conductive contact plug 133 may be formed under the bit-line contact pads (BLCP), such that the third conductive contact plug 133 can be electrically coupled to the lower connection pattern 131. The bit-line contact (BLC) may be formed over the bit-line contact pads (BLCP), such that the bit-line contact (BLC) can be electrically coupled to the bit line.

Conductive lines (A) are disposed in the second region (SR) located at both sides (i.e., an upper side and a lower side) relative to the first region (BLOFC). Within the first region (BLOFC), however, conductive lines (A) may be disconnected from the bit-line contact pads (BLCP), such that the conductive lines (A) are not coupled to the bit lines (not shown). That is, as shown in FIG. 4, although the conductive lines (A) are formed or disposed in the same layer as the bit-line contact pads (BLCP), the conductive lines (A) are not electrically coupled to the bit-line contact pads (BLCP). As a result, the conductive lines (A) have an improved degree of freedom in line connection because they are not electrically coupled to the bit lines (not shown), i.e., the conductive lines (A) are not used as the bit-line connection pads. Although the conductive lines (A) shown in FIG. 5 are, as an example, disposed in a horizontal direction for convenience of description, the scope or spirit of the disclosed technology is not limited thereto, and it should be noted that the conductive lines (A) can also be disposed in a vertical direction or in other directions.

The conductive lines (A) and the connection patterns 131 disposed in the second region (SR), located at both sides (i.e., an upper side and a lower side) in relation to the bit-line contact region (BLOFC), may be electrically coupled to the page buffers (PB) (see FIG. 3) of the stages, which are also located or disposed in in the second region (SR).

The bit-line contact pads (BLCP) may serve as the landing pads of the bit-line contacts, such that the bit-line contact pads (BLCP) can be coupled to the bit lines through the upper bit-line contact (BLC). Referring to FIG. 5, a virtual line that is formed to traverse the center part of the bit-line contact region (BLOFC) in the second direction (SD) is denoted by a line "VL". As a result, the bit-line contact pads (BLCP) disposed at one side (i.e., at the upper side) of the line (VL) can be electrically coupled to the page buffers (PB) (see FIG. 3) of the stage located at the same side (i.e., at the upper side) in the first direction (FD). Similarly, the bit-line contact pads (BLCP) located at the other side (at a lower side) of the line (VL) may be electrically coupled to the page buffers (PB) (see FIG. 3) of the stage located at same side (at the lower side) in the first direction (FD).

The bit-line contact pads (BLCP) located at one side of the virtual line (VL) and the other bit-line contact pads (BLCP) located at the other side of the virtual line (VL) may mirror each other relative to the virtual line (VL). The bit-line contact pads (BLCP) located in an adjacent region within the bit-line contact region (BLOFC) may have a mirrored symmetrical structure arranged in the second direction (SD) based on the center part of the first direction (FD). (i.e., a vertical direction intersecting the virtual line VL)

A predetermined number of the bit-line contact pads (BLCP) disposed over the bit-line contact region (BLOFC) may be paired (or grouped), such that the bit-line contact pads (BLCP) may be formed as pairs of bit-line contact pads (BLCP). As a result, such paired patterns may be disposed over the same connection patterns 131 in the first direction (FD). A predetermined number of the bit-line contact pads (BLCP) may be consecutively formed in the first direction (FD) when viewed in a view in the third direction (TD).

For example, the bit-line contact pads (BLCP) may be configured in a manner that four patterns (i.e., four bit-line contact pads) on one side of virtual line VL are arranged in the form of one line in the first direction (FD). However, one of the four bit-line contact pads (BLCP) may be disposed to deviate or to be offset from the remaining three bit-line contact pads (BLCP) in the second direction (SD). Consequently, the offset bit-line contact pads (BLCP) may correspond to a connection pattern 131 that is different from the connection pattern 131 corresponding to the other three bit-line contact pads (BLCP).

Although FIG. 5 has exemplarily disclosed that the bit-line contact pads (BLCP) are arranged in a manner such that three bit-line contact pads (BLCP) are arranged in one direction and the remaining one bit-line contact pad (BLCP) is offset in the other direction for convenience of description, the scope or spirit of the disclosed technology is not limited thereto and other configurations may be used.

Figure 6:
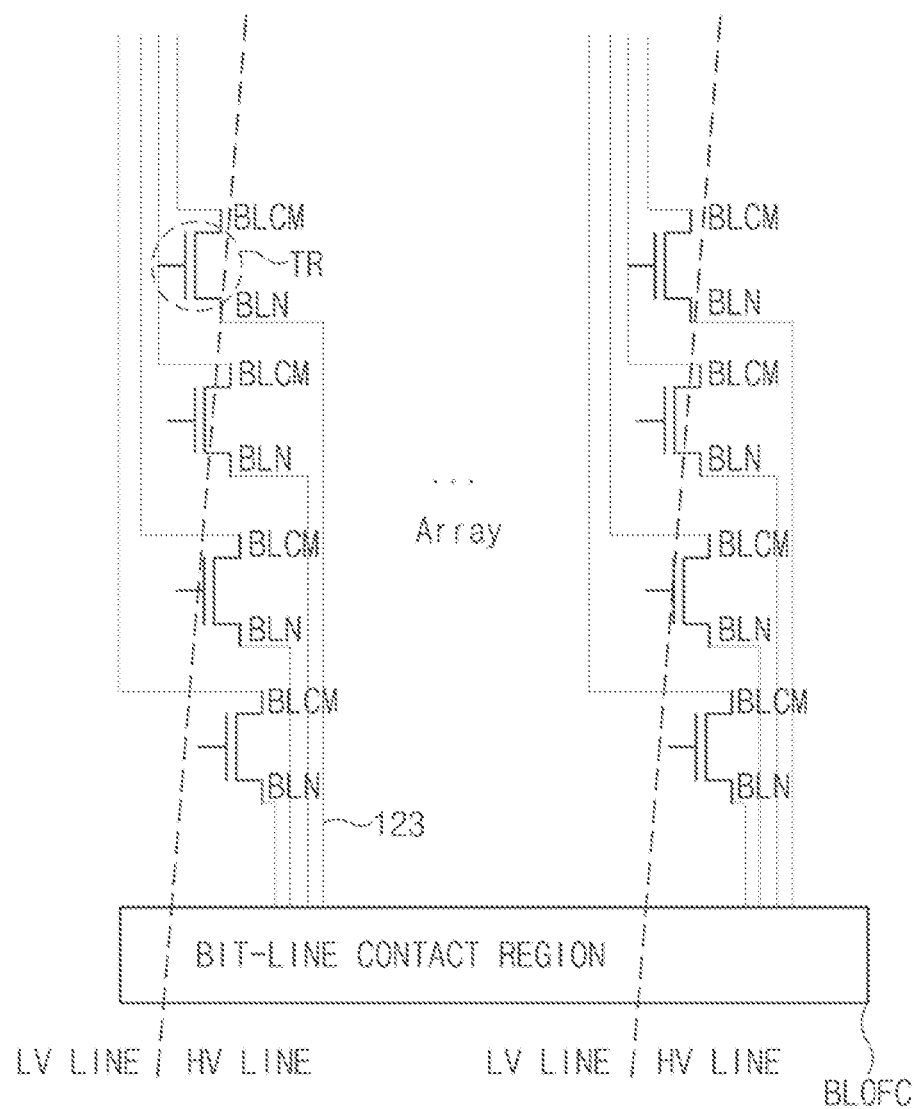
FIG. 6 is a schematic diagram illustrating a connection relationship between a bit-line contact region and transistors contained in a page buffer circuit in FIG. 2 in accordance with an embodiment of the disclosure.

FIG. 6 is a schematic diagram illustrating a connection relationship between the bit-line contact region (BLOFC) and transistors contained in a page buffer circuit in FIG. 2 in accordance with an embodiment of the disclosure.

Referring to FIG. 6, the transistors (TR) may be contained in the page buffer circuit (PB) shown in FIG. 3. The transistors (TR) may be used to read out data from the cell strings (CST), or may be used to program the cell strings (CST). Each of the transistors (TR) may be coupled between a bit-line connection node (BLN) and another bit-line connection node (BLCM).

Lines of the bit-line connection node (BLN) may be coupled to the bit-line contact region (BLOFC) through lines (HV) of a high-voltage page buffer. In addition, lines of the bit-line connection node (BLCM) may be coupled to lines (LV) of a low-voltage page buffer. The transistors (TR) may be coupled to lower conductive lines (i.e., the connection patterns 123). The connection patterns 123 may be electrically coupled to the bit-line contact pads (BLCP) contained in the bit-line contact region (BLOFC).

In a stacked semiconductor device, the transistors (TR) contained in the page buffer (PB) may be formed below the memory cell array 30 on the basis of the third direction (TD). The connection patterns 123 (i.e., lines HV) of the transistors (TR) may be electrically coupled to the bit lines (BL) of the memory cell array 30 formed at an upper part of the stacked semiconductor device.

Figure 7:
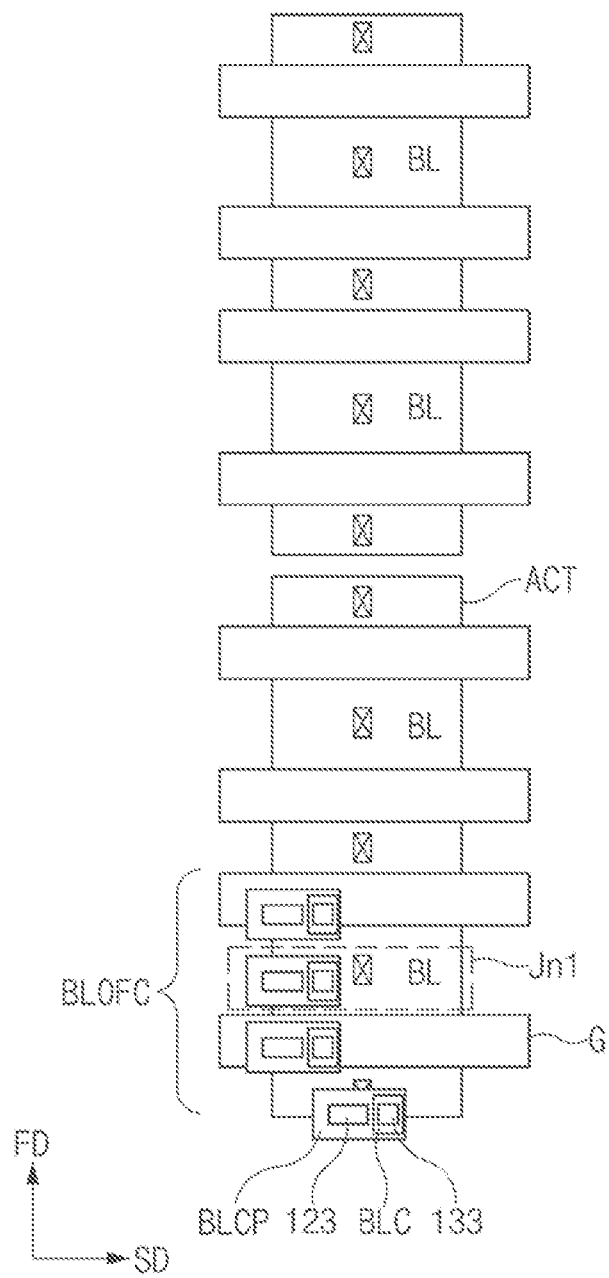
FIG. 7 is a plan view illustrating a layout structure of bit-line contact pads in FIG. 6 in accordance with an embodiment of the disclosure.

FIG. 7 is a plan view illustrating a layout structure of the bit-line contact pads in FIG. 6 in accordance with an embodiment of the disclosure.

Referring to FIG. 7, a gate electrode (G) may correspond to a gate electrode of each transistor (TR) shown in FIG. 6. A gate electrode (G) may be disposed over an active region (ACT). Each of the gate electrodes (G) may extend in the second direction (SD). The gate electrodes (G) may be spaced apart from each other by a predetermined distance in the first direction (FD).

In the bit-line contact region (BLOFC), the bit-line contact pads (BLCP) may be spaced apart from each other by a predetermined distance in the first direction (FD). The bit-line contact pads (BLCP) may be coupled to the corresponding connection patterns.

The bit-line contact pads (BLCP) may be electrically coupled to the corresponding connection patterns 123 through the second conductive contact plug 125. The bit-line contact pads (BLCP) may be electrically coupled to the lower connection patterns 131 through the third conductive contact plug 133. The bit-line contact pads (BLCP) may be electrically coupled to the bit lines (BL) through the bit-line contacts (BLC).

A detailed description of the connection patterns 123, the connection patterns 131, and the bit-line contacts (BLC), which are substantially identical to those described in connection with FIG. 4, will herein be omitted for convenience of description.

The bit-line contact pads (BLCP) may be disposed to overlap with some parts of the gate electrodes (G). For example, four bit-line contact pads (BLCP) are illustrated in FIG. 3, and two bit-line contact pads (BLCP) from among four bit-line contact pads (BLCP) may be disposed to overlap with adjacent gate electrodes (G). Although three contiguous bit-line contact pads (BLCP) from among the four bit-line contact pads (BLCP) are arranged in the form of one line in the first direction (FD), only one bit-line contact pad (BLCP) may be disposed to deviate from the three remaining bit-line contact pads (BLCP) in the second direction (SD).

At least one (e.g., the connection pattern 123) of the connection patterns coupled to the four bit-line contact pads (BLCP) may be disposed at least over the junction region (Jn1) of the transistor (TR). That is, at least one of the four connection patterns 123 may be disposed in the space interposed between the gate electrodes (G) contiguous to each other in the first direction (FD). In other words, the connection patterns 123 coupled to the bit-line contact pads (BLCP) disposed in the bit-line contact region (BLOFC) may be disposed over the junction (Jn1) of the lower transistor (TR), as viewed in the third direction (TD). The upper bit-line contact pads (BLCP), when viewed along the third direction (TD), may be electrically coupled to the junction (Jn1) of the lower transistor (TR) through the connection patterns 123.

In the above-mentioned embodiments of the disclosed technology, the bit-line contact pads (BLCP) may be formed over the bit-line contact region (BLOFC), and each bit-line contact pad (BLCP) may be formed in an island-like shape in which a line structure of the bit-line contact pad (BLCP) is disconnected from other connection lines formed in the same layer. Therefore, semiconductor devices according to embodiments of the disclosed technology can improve the degree of freedom in line connections of conductive lines (A) in the remaining regions outside of the bit-line contact regions (BLOFC).

Figure 8:
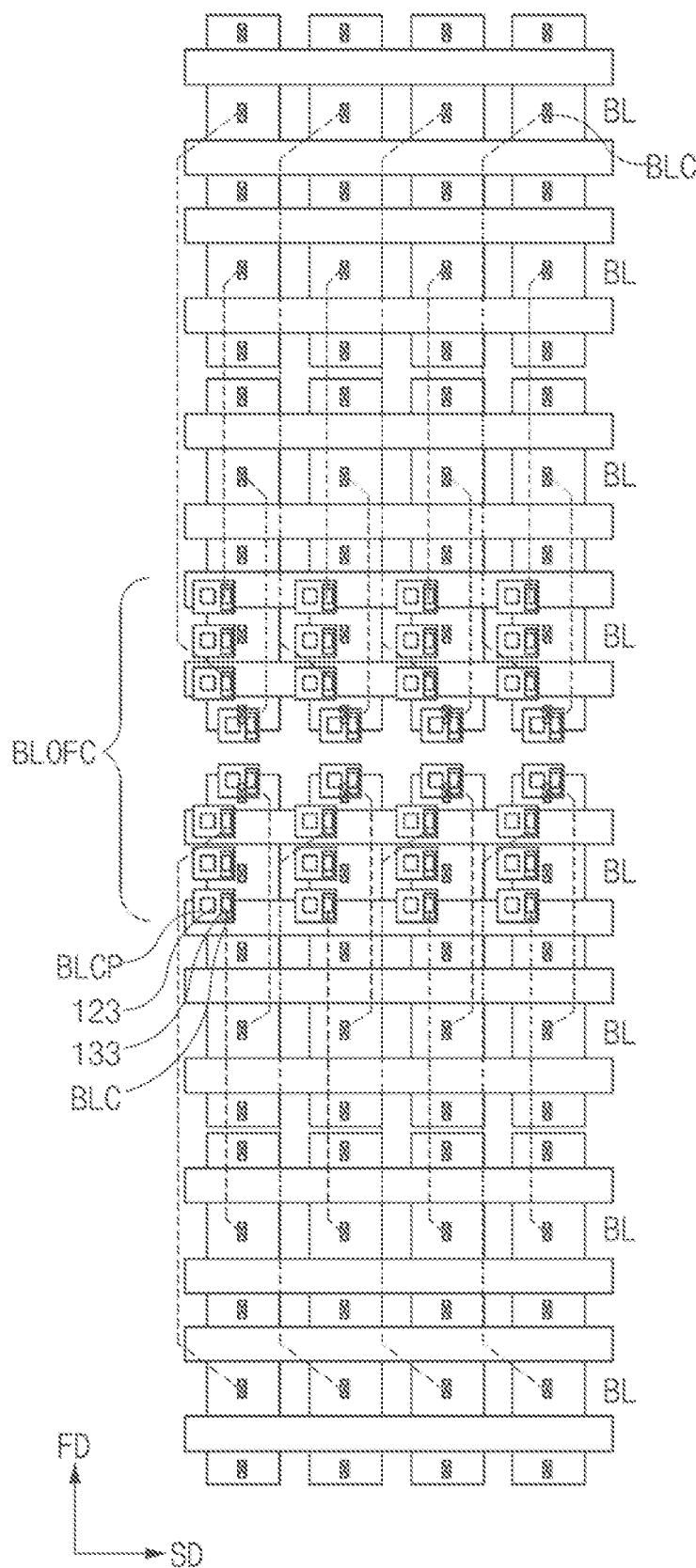
FIGS. 8 and 9 are plan views illustrating layout structures of bit-line contact pads in FIG. 6 in accordance with an embodiment of the disclosure.
Figure 9:
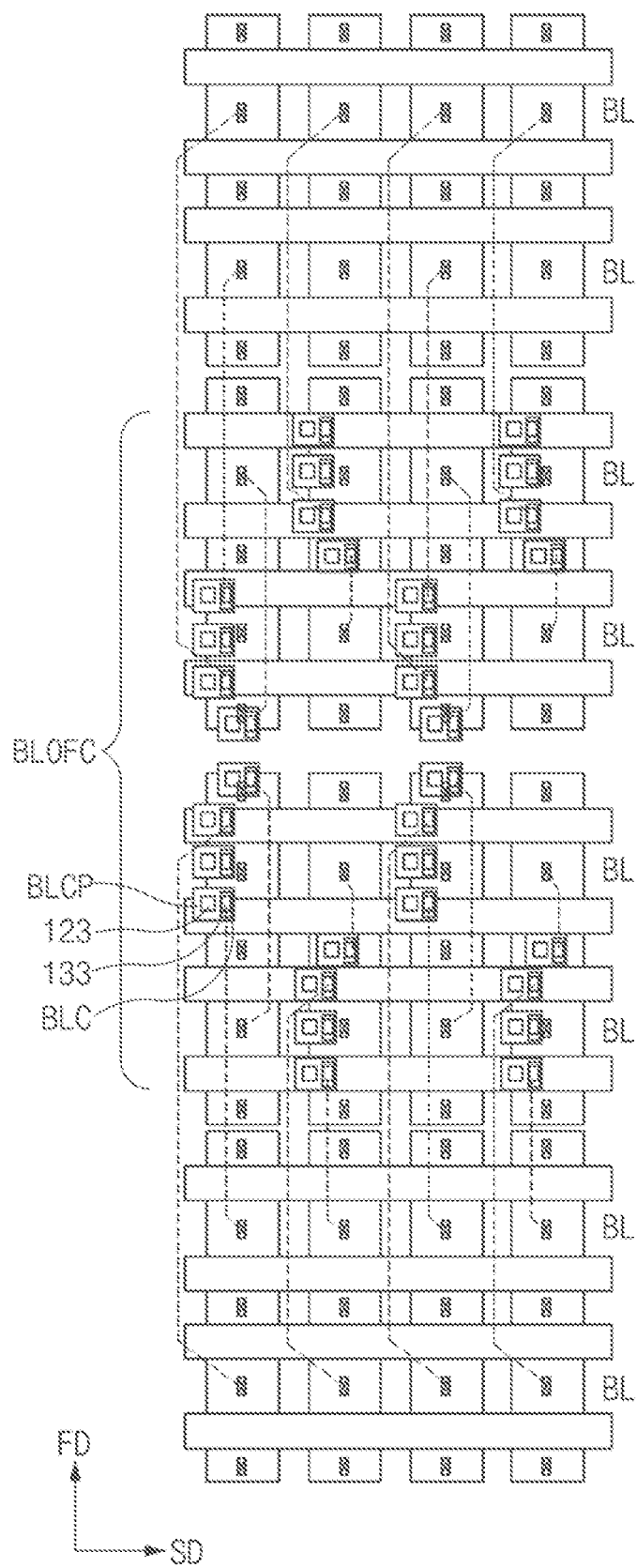

FIGS. 8 and 9 are plan views illustrating layout structures of the bit-line contact pads (BLCP) in FIG. 6 in accordance with an embodiment of the disclosure.

Referring to FIG. 8, the bit-line contact pads (BLCP) in the bit-line contact region (BLOFC) may be arranged in identical patterns. The patterns, each of which includes four bit-line contact pads (BLCP), may be arranged in four columns in the second direction (SD). Two rows of patterns, each of which includes four bit-line contact pads (BLCP), may be arranged in two stages, within the bit-line contact region (BLOFC), in the first direction (FD).

Referring to FIG. 9, identical patterns, each of which includes four bit-line contact pads (BLCP), in the bit-line contact region (BLOFC) may be arranged in four columns in the second direction (SD). The patterns, each of which includes four bit-line contact pads (BLCP), may be arranged in a zigzag, dogleg, or angled arrangements. In addition, the patterns, each of which includes four bit-line contact pads (BLCP), may be arranged in four stages, within the bit-line contact region (BLOFC), in the first direction (FD).

The above-mentioned embodiments have exemplarily disclosed that the patterns, each of which includes four bit-line contact pads (BLCP), in the bit-line contact region (BLOFC) are arranged in two stages or four stages in the second direction (FD). However, the scope or spirit of the disclosed technology is not limited thereto, and in other embodiments, the number of bit-line contact pads (BLCP) and the arrangement shape of the bit-line contact pads (BLCP) can also be changed as necessary.

As is apparent from the above description, semiconductor devices based on implementations of the disclosed technology can improve the degree of freedom in conductive line connections.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, those skilled in the art will understand that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
   a plurality of gate electrodes formed to extend in a second direction, and spaced apart from each other by a predetermined distance in a first direction in a plan view; and
   a plurality of bit-line contact pads that extend in the second direction and are spaced apart from each other by a predetermined distance in the first direction,
   wherein each of the plurality of bit-line contact pads, disposed between a corresponding bit line and a corresponding lower connection structure in a vertical direction to electrically connect the corresponding bit line to the corresponding lower connection structure, has an island shape in the plan view,
   wherein:
   each of the plurality of gate electrodes corresponds to a respective bit-line contact pad from among the plurality of bit-line contact pads, each gate electrode overlaps an entire length of the corresponding bit-line contact pad in the second direction in the plan view, and
   each of the plurality of bit-line contact pads is electrically coupled to a corresponding lower connection patterns through a corresponding conductive contact plugs.

2. The semiconductor device according to claim 1, wherein:
   at least a part of the plurality of bit-line contact pads are arranged in a line in the first direction.

3. The semiconductor device according to claim 2, wherein:
   at least one of the plurality of the bit-line contact pads deviates from the remainder of the plurality of the bit-line contact pads in the second direction.

4. The semiconductor device according to claim 1, wherein:
   at least one of the plurality of the bit-line contact pads is disposed over a junction region of a transistor along the vertical direction.

5. The semiconductor device according to claim 1, wherein the plurality of the bit-line contact pads are arranged in a pattern.

6. The semiconductor device according to claim 1, wherein:
   a plurality of lower connection patterns overlap with the plurality of bit-line contact pads.

7. The semiconductor device according to claim 1, wherein:
   a plurality of conductive contact plugs overlaps with the plurality of bit-line contact pads, respectively.

8. The semiconductor device according to claim 1, wherein:
   the plurality of bit-line contact pads overlap a plurality of lower connection patterns such that each bit-line contact pad overlaps entirety of a corresponding lower connection pattern.

9. The semiconductor device according to claim 1, wherein:
   each of the plurality of bit-line contact pads is electrically coupled to the corresponding bit lines through a corresponding bit-line contacts.

10. The semiconductor device according to claim 9, wherein:
   the plurality of bit-line contacts overlaps with the plurality of bit-line contact pads, respectively.

* * * * *